United States Patent
Cho et al.

(10) Patent No.: US 8,017,045 B2
(45) Date of Patent: Sep. 13, 2011

(54) COMPOSITION FOR OXIDE SEMICONDUCTOR THIN FILM AND FIELD EFFECT TRANSISTOR USING THE COMPOSITION

(75) Inventors: Doo Hee Cho, Daejeon (KR); Shin Hyuk Yang, Gyeonggi-do (KR); Chun Won Byun, Daejeon (KR); Chi Sun Hwang, Daejeon (KR); Hye Yong Chu, Daejeon (KR); Kyoung Ik Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 217 days.

(21) Appl. No.: 12/331,688

(22) Filed: Dec. 10, 2008

(65) Prior Publication Data

US 2009/0261389 A1    Oct. 22, 2009

(30) Foreign Application Priority Data

Apr. 16, 2008  (KR) .................. 10-2008-0035132
Jun. 23, 2008  (KR) .................. 10-2008-0058878

(51) Int. Cl.
*H01B 1/02* (2006.01)
(52) U.S. Cl. ........... 252/519.51; 257/288; 257/E21.615; 257/29.255; 438/104
(58) Field of Classification Search .............. None
See application file for complete search history.

(56) References Cited

U.S. PATENT DOCUMENTS

| | | |
|---|---|---|
| 2003/0218221 A1 | 11/2003 | Wager et al. |
| 2003/0218222 A1 | 11/2003 | Wager et al. |
| 2004/0127038 A1 | 7/2004 | Carcia et al. |
| 2005/0199879 A1 | 9/2005 | Hoffman et al. |
| 2005/0199880 A1 | 9/2005 | Hoffman et al. |
| 2006/0113539 A1 | 6/2006 | Sano et al. |
| 2006/0163655 A1 | 7/2006 | Hoffman et al. |
| 2007/0141784 A1 | 6/2007 | Wager et al. |
| 2007/0194379 A1* | 8/2007 | Hosono et al. ............ 257/347 |
| 2007/0284574 A1* | 12/2007 | Hoffman et al. ............ 257/43 |
| 2007/0287221 A1* | 12/2007 | Ong et al. ............ 438/104 |

FOREIGN PATENT DOCUMENTS

JP    2000-150900    5/2000

(Continued)

OTHER PUBLICATIONS

Jackson et al., Zinc tin oxide transistors on flexible substrates, Journal of Non-Crystalline Solids, 2006, pp. 1753-1755, vol. 352.

*Primary Examiner* — Minh-Loan T Tran
*Assistant Examiner* — Fei Fei Yeung Lopez
(74) *Attorney, Agent, or Firm* — Rabin & Berdo, P.C.

(57) ABSTRACT

Provided is a composition for an oxide semiconductor thin film and a field effect transistor (FET) using the composition. The composition includes from about 50 to about 99 mol % of a zinc oxide (ZnO); from about 0.5 to 49.5 mol % of a tin oxide ($SnO_x$); and remaining molar percentage of an aluminum oxide ($AlO_x$). The thin film formed of the composition remains in amorphous phase at a temperature of 400° C. or less. The FET includes an active layer formed of the composition and has improved electrical characteristics. The FET can be fabricated using a low-temperature process without expensive raw materials, such as In and Ga.

9 Claims, 7 Drawing Sheets

FOREIGN PATENT DOCUMENTS

| | | |
|---|---|---|
| JP | 2004-103957 | 4/2004 |
| JP | 2007-073701 A | 3/2007 |
| JP | 2007-123702 | 5/2007 |
| JP | 2007-142195 | 6/2007 |
| JP | 2007-142196 | 6/2007 |
| KR | 20050037051 A | 4/2005 |
| KR | 100814901 B1 | 3/2008 |
| KR | 100939998 B1 | 1/2010 |

* cited by examiner

COMPOSITION FOR OXIDE SEMICONDUCTOR THIN FILM AND FIELD EFFECT TRANSISTOR USING THE COMPOSITION

CROSS-REFERENCE TO RELATED APPLICATION

This application claims priority to and the benefit of Korean Patent Application No. 2008-35132, filed Apr. 16, 2008, and Korean Patent Application No. 2008-58878, filed Jun. 23, 2008, the disclosures of which are incorporated herein by reference in their entirety.

BACKGROUND

1. Field of the Invention

The present invention relates to a composition for an oxide semiconductor thin film which can be used as an active layer for various semiconductor devices such as a field effect transistor (FET), a FET using the composition, and a method of fabricating the FET.

2. Discussion of Related Art

Materials used for conventional semiconductor thin films include Group IV elements such as silicon (Si) and germanium (Ge), Group III-V compounds such as GaAs, and Group II-VI compounds such as CdS. Since most of the conventional semiconductor materials have small bandgaps, they intensely represent specific colors or cannot transmit visible light.

In recent years, oxide semiconductors and organic semiconductors have been developed and have attracted considerable attention with the beginning of the era of transparent semiconductors. Zinc oxide (ZnO), which is a Group II-VI compound, is a typical oxide semiconductor. ZnO, which has higher field effect mobility (an important physical property for semiconductors) than amorphous Si (a-Si) as well as other excellent characteristics, has been under study for a long time and now appears close to commercialization. However, variations in physical properties according to a fabrication process, low durability, and low resistance to environmental changes are drawbacks of ZnO.

In addition to ZnO, many patents on transparent semiconductor compositions using oxide have been proposed.

Japanese Patent Laid-open Publication No. 2000-150900 has proposed a technique related to a transparent semiconductor thin film having compositions of ZnO, CdO, CdZnO, and MgZnO.

Also, Japanese Patent Laid-open Publication No. 2004-103957A2 has introduced a semiconductor thin film with a composition of $InMO_3(ZnO)_m$ (M is Fe, Ga, or Al, and m is an integer ranging from 1 to 49).

U.S. Patent Publication No. 2003-218221A1 has taught a thin film transistor (TFT) using an active layer formed of a substantial oxide insulator selected from ZnO and $SnO_2$, and U.S. Patent Publication No. 2003-218222A1 has taught a transparent TFT using an active layer formed of a transparent oxide selected from the group consisting of ZnO, $SnO_2$, and $In_2O_3$.

U.S. Patent Publication No. 2005-199879A1 has proposed a semiconductor technique using a channel formed of an oxide containing two compounds selected from the group consisting of CdO, SrO, CaO, and MgO.

Also, U.S. Patent Publication No. 2005-199880A1 (Hewlett-Packard, Inc.) has disclosed a semiconductor composition of AxBxCxO(A: Zn, Cd, B: Ga, In, C: Ge, Sn, Pb) and a semiconductor device using the same, and U.S. Patent Publication No. 2006-163655A1 has disclosed a semiconductor material with a composition of AxBxO(A: Cu, Ag, Sb, B: Cu, Ag, Sb, Zn, Cd, Ga, In, Sn, Pb) and a semiconductor device using the same.

Japanese Patent Laid-open Publication No. 2007-123702 (Toppan printing Co., Ltd.) has disclosed a TFT using an active layer formed by stacking an oxide semiconductor "a" formed of one selected from the group consisting of ZnO, $SnO_2$, $In_2O_3$, and $Zn_2SnO_4$ and a thin interlayer oxide layer "b" having a tunneling effect.

Japanese Patent Laid-open Publication No. 2007-142195 (Idemitsu Kosan Co., Ltd.) has disclosed a display device using a TFT having an amorphous oxide layer formed of ZnO and $In_2O_3$, and Japanese Patent Laid-open Publication No. 2007-142196 has disclosed an oxide semiconductor having an amorphous layer formed of ZnO and $SnO_2$.

U.S. Patent Publication No. 2006-0113539A1 (Canon, Inc.) has proposed a field effect transistor (FET) using an active layer formed of an amorphous material with compositions of an In—Zn—Sn—O oxide and an In—Zn—Ga—O oxide.

In addition to the above-described references, there has been a substantial amount of research conducted on TFTs using an active layer formed of an $In_2O_3$—ZnO-based semiconductor, an $SnO_2$—ZnO-based material, and an In—Ga—Zn—O-based material. In—Ga—Zn—O TFTs have been actively studied and are now close to commercialization.

A TFT using an oxide semiconductor thin film as an active layer may be typically employed as a backplane device for various active-matrix display panels, such as active-matrix organic light emitting diodes (AMOLED) displays and active-matrix liquid crystal displays (AMLCDs). According to recently published research reports, the TFT using the oxide semiconductor thin film as the active layer may be used as a driver device for various display devices and image sensors. Various electronic circuits, such as an RFID tag, may be configured on a glass substrate or a plastic substrate using the above-described TFTs.

The present inventors have developed a semiconducting material with a new composition that improves electrical properties, facilitates fabrication processes, and lowers manufacturing cost without using expensive raw materials, such as indium (In) and gallium (Ga).

SUMMARY OF THE INVENTION

The present invention is directed to a new composition for a transparent oxide semiconductor thin film which remains in amorphous phase even when heated to 400° C.

Also, the present invention is directed to a field effect transistor (FET) using an active layer formed of a composition for an oxide semiconductor thin film, in which the active layer can remain in amorphous phase even when heated to 400° C.

Furthermore, the present invention is directed to a method of fabricating a FET using an active layer formed of a composition for an oxide semiconductor thin film, in which the active layer can remain in amorphous phase even when heated to 400° C.

One aspect of the present invention provides a composition for an oxide semiconductor thin film. The composition includes: an aluminum (Al) oxide; a zinc (Zn) oxide; and a tin (Sn) oxide. The thin film formed of the composition is in amorphous phase at a temperature of 400° C. or less.

The composition including the aluminum oxide, the zinc oxide, and the tin oxide may contain 50 to 99 mol % ZnO, 0.5 to 49.5 mol % $SnO_x$, and the remaining molar percentage $AlO_x$.

The aluminum oxide may be $Al_2O_3$, the zinc oxide may be ZnO, and the tin oxide may be $SnO_2$.

Another aspect of the present invention provides a FET including source and drain electrodes, a gate insulator, an active layer, and a gate electrode disposed on a substrate. The active layer comprises an oxide thin film containing aluminum (Al), zinc (Zn), and tin (Sn) that is in amorphous phase at a temperature of 400° C. or less, and at least one of the source and drain electrodes and the gate electrode is formed of a transparent conducting material that transmits visible light.

The oxide forming the active layer may contain 50 to 99 mol % ZnO, 0.5 to 49.5 mol % $SnO_x$, and the remaining molar percentage $AlO_x$.

The aluminum oxide may be $Al_2O_3$, the zinc oxide may be ZnO, and the tin oxide may be $SnO_2$.

The FET may have a bottom-gate coplanar structure in which the gate electrode, the gate insulating layer, the source and drain electrodes, and the active layer are sequentially disposed on the substrate, a bottom-gate staggered structure in which the gate electrode, the gate insulating layer, the active layer, and the source and drain electrodes are sequentially disposed on the substrate, a top-gate coplanar structure in which the source and drain electrodes, the active layer, the gate insulating layer, and the gate electrode are sequentially disposed on the substrate, or a top-gate staggered structure in which the active layer, the source and drain electrodes, the gate insulating layer, and the gate electrode are sequentially disposed on the substrate.

Yet another aspect of the present invention provides a method of fabricating a FET. The method includes forming a gate electrode, a gate insulator, an active layer, and source and drain electrodes on a substrate. The active layer is formed by depositing an oxide containing aluminum (Al), zinc (Zn), and tin (Sn) at room temperature to a temperature of about 200° C., which is in amorphous phase at a temperature of 400° C. or less.

The active layer may be deposited using a radio-frequency (RF)/direct-current (DC) magnetron sputtering process, a pulsed laser deposition (PLD) process, a thermal evaporation process, or a chemical vapor deposition (CVD) process.

The FET may be post-annealed at a temperature of 200° C. or less.

The electrical properties of the active layer of the EFT may be controlled by Al or Sn content of the active layer. Also, the electrical properties of the active layer may be controlled by $O_2$ partial pressure of a deposition chamber.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

According to an exemplary embodiment of the present invention, a composition for an oxide semiconductor thin film comprises an aluminum (Al) oxide, a zinc (Zn) oxide, and a tin (Sn) oxide, in which the thin film formed of the composition remains in amorphous phase at a temperature of 400° C. or less.

The thin film formed of Al—Zn—Sn oxide may be in amorphous phase at room temperature and still remain in the amorphous phase even when heated to a temperature of about 400° C.

In the composition comprising the aluminum oxide, the zinc oxide, and the tin oxide, an atomic ratio of Al:Zn:Sn may be variously selected in the range maintaining the amorphous phase. Preferably, but not necessarily, the composition may contain 50 to 99 mol % ZnO, 0.5 to 49.5 mol % $SnO_x$, and the remaining molar percentage $AlO_x$.

The aluminum oxide may be $Al_2O_3$, the zinc oxide may be ZnO, and the tin oxide may be $SnO_2$.

The above-described composition for an oxide semiconductor thin film may be typically used for an active layer of a field effect transistor (FET).

Figure 1:
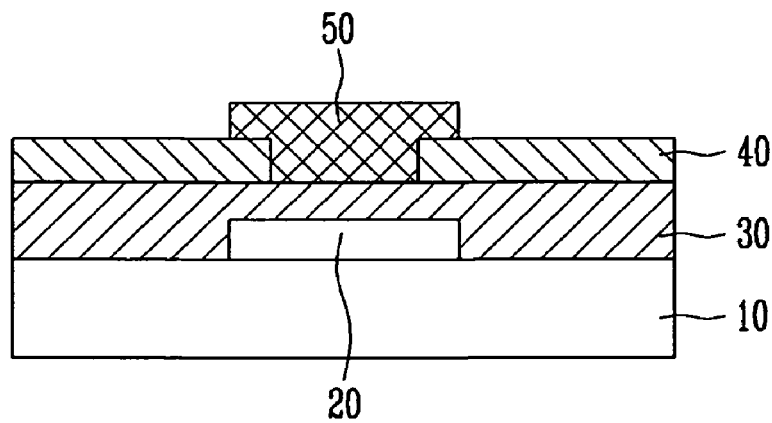
FIG. 1 is a cross-sectional view of a bottom-gate coplanar field effect transistor (FET) according to an exemplary embodiment of the present invention.
Figure 2:
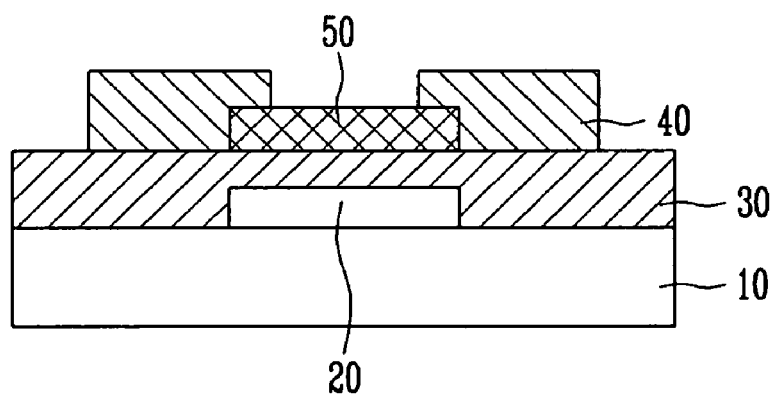
FIG. 2 is a cross-sectional view of a bottom-gate staggered FET according to an exemplary embodiment of the present invention.
Figure 3:
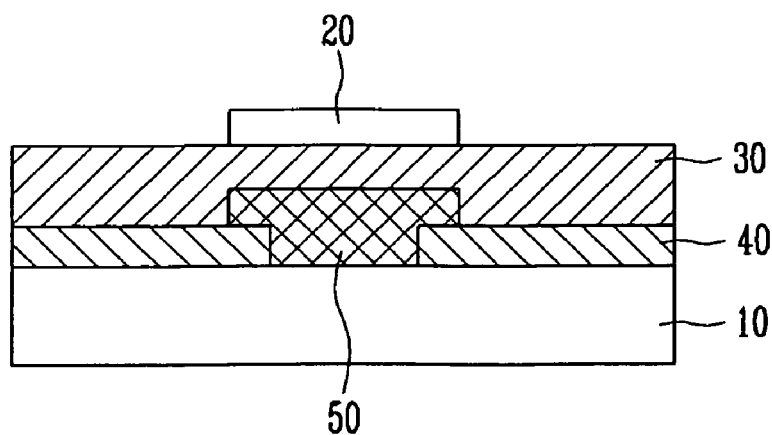
FIG. 3 is a cross-sectional view of a top-gate coplanar FET according to an exemplary embodiment of the present invention.
Figure 4:
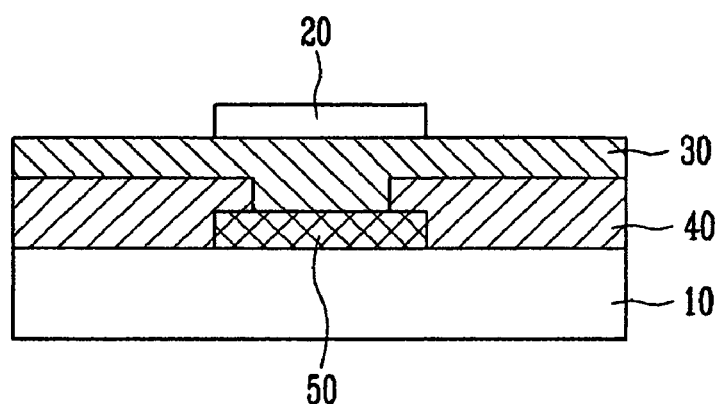
FIG. 4 is a cross-sectional view of a top-gate staggered FET according to an exemplary embodiment of the present invention.

The FET may be a bottom-gate coplanar thin film transistor (TFT) in which a gate electrode 20, a gate insulating layer 30, source and drain electrodes 40, and an active layer 50 are sequentially stacked on a substrate 10 as shown in FIG. 1, a bottom-gate staggered TFT in which a gate electrode 20, a gate insulating layer 30, an active layer 50, and source and drain electrodes 40 are sequentially stacked on a substrate 10 as shown in FIG. 2, a top-gate coplanar TFT in which source and drain electrodes 40, an active layer 50, a gate insulating layer 30, and a gate electrode 20 are sequentially stacked on a substrate 10 as shown in FIG. 3, or a top-gate staggered TFT in which an active layer 50, source and drain electrodes 40, a gate insulating layer 30, and a gate electrode 20 are sequentially stacked on a substrate 10 as shown in FIG. 4.

Referring to FIG. 1, the FET according to an exemplary embodiment of the present invention may include the substrate 10, the gate electrode 20, the gate insulator 30, the source and drain electrodes 40, and the active layer 50.

The substrate 10 may be a substrate known to one of ordinary skill in the art, for example, a glass, metal foil, plastic, or silicon(Si) substrate.

The gate electrode 20 may be formed of a transparent oxide such as indium tin oxide (ITO), indium zinc oxide (IZO), or ZnO:Al(Ga), various low-resistance metals such as Ti, Ag, Au, Al, Cr, Al/Cr/Al, or Ni, or a conductive polymer, but the present invention is not limited thereto. The gate electrode 20 may be formed by depositing one of the above-described materials on the substrate 10 to an ordinary thickness using a sputtering process, an atomic layer deposition (ALD) process, or a chemical vapor deposition (CVD) process and patterning the deposited material.

The gate insulator 30 may be formed on the substrate 10 and the gate electrode 20. The gate insulator 30 may be formed of at least one transparent oxide or nitride, for example, $SiN_x$, AlON, $TiO_2$, $AlO_x$, $TaO_x$, $HfO_x$, SiON, or $SiO_x$, and preferably, though not necessarily, $Al_2O_3$. In addition, the gate insulator 30 may be formed of a polymer. The gate insulator 30 may be formed to an ordinary thickness using an ALD process, a plasma-enhanced CVD (PECVD) process, or other sputtering processes. Although not shown, after the gate insulator 30 is formed, an electrode-connecting through holes may be formed.

The source and drain electrodes 40 may be formed on the gate insulator 30. Like the gate electrode 20, the source and drain electrodes 40 may be formed of a transparent oxide such as ITO, IZO, or ZnO:Al(Ga), a metal such as Al, Cr, Au, Ag, or Ti, or a conductive polymer, but the present invention is not limited thereto. In another case, the source and drain electrodes 40 may be formed of a multiple layer of a metal and an oxide. The source and drain electrodes 40 may be formed by depositing one of the above-described materials to an ordinary thickness using a sputtering process, an ALD process, or a CVD process and patterning the deposited material.

The active layer 50 may be formed on the source and drain electrodes 40 and a channel region. The active layer 50 may be formed of a composition for an oxide semiconductor thin film, which contains an aluminum oxide, a zinc oxide, and a tin oxide. The active layer formed of the composition remains in amorphous phase at a temperature of 400° C. or less. The composition may contain 50 to 99 mol % ZnO, 0.5 to 49.5 mol % $SnO_x$, and the remaining molar percentage $AlO_x$. Also, the aluminum oxide may be $Al_2O_3$, the zinc oxide may be ZnO, and the tin oxide may be $SnO_2$.

The active layer 50 may be formed by depositing the material formed of the aluminum oxide, the zinc oxide, and the tin oxide using a radio-frequency (RF)/direct-current (DC) magnetron sputtering process, a pulsed laser deposition (PLD) process, a thermal evaporation process, or a CVD process. The active layer 50 may be formed to a thickness of about 10 to 50 nm, but the present invention is not limited thereto.

The composition including the aluminum oxide, the zinc oxide, and the tin oxide may be deposited at room temperature to a temperature of about 200° C., and preferably, though not necessarily, about 150° C.

Although not shown, a passivation layer may be formed on the active layer 50. For example, the passivation layer may be formed by coating a polymer material, such as a polyimide polymer, using a spin coating process, a dip coating process, or a casting process and patterning the polymer material. Alternatively, the passivation layer may be formed by depositing an insulating material, such as $SiO_2$ or $Al_2O_3$, using a CVD process or an ALD process and patterning the insulating material.

During the formation of the above-described layers, all the patterning processes may be performed using a photolithography process and a wet etching process.

ZnO-based, Zn—Sn—O-based, In—Zn—O-based, and In—Ga—Zn—O-based oxide TFTs, which have been reported thus far, may exhibit FET characteristics only when they are annealed at a high temperature of about 200° C. or higher or a thin film is deposited at a high temperature. However, a FET using an active layer formed of an Al—Zn—Sn oxide according to the present invention may exhibit transistor characteristics even when the active layer is formed at room temperature. In addition, when the FET according to the present invention is post-annealed at a temperature of about 150 to 200° C., it can exhibit better transistor characteristics.

The Al—Zn—Sn oxide for a semiconductor thin film according to the present invention is a very chemically stable compound. Even if annealed at a temperature of 400° C. or less, the thin film formed of the Al—Zn—Sn oxide remains in amorphous phase. Thus, the Al—Zn—Sn oxide for a semiconductor thin film has advantages for fabrication of a uniform large-area device and maintains stable characteristics during various high-temperature and etching processes. Also, when the Al—Zn—Sn oxide according to the present invention is used for an electronic device, such as a TFT, it can maintain stable characteristics for a long time due to its high durability.

The Al—Zn—Sn oxide according to the present invention may be employed not only as a semiconductor material for an active layer of an N-type FET but also as an N-type semiconductor layer of a diode.

Furthermore, the Al—Zn—Sn oxide according to the present invention may be adopted as an insulating thin film having a resistivity of $10^{12}$ Ω cm or higher according to $O_2$ partial pressure and Sn content. The electrical properties (e.g., electrical conductivity) of a thin film formed of the Al—Zn—Sn oxide according to the present invention may be controlled by Al and Sn contents. In addition, the electrical characteristics of a FET using an active layer formed of the Al—Zn—Sn oxide according to the present invention may be varied.

The electrical conductivity and other electrical properties of a thin film formed of the Al—Zn—Sn oxide according to the present invention may be controlled by $O_2$ partial pressure of a deposition chamber during fabrication of the thin film. Also, the electrical characteristics of a FET using the Al—Zn—Sn oxide as an active layer may be varied according to $O_2$ partial pressure applied during fabrication of the thin film.

The electrical conductivity and other electrical properties of a thin film formed of an Al—Zn—Sn oxide according to the present invention may be controlled by post-annealing temperature and atmosphere provided during fabrication of the thin film. Also, the electrical characteristics of a FET using the Al—Zn—Sn oxide as an active layer may be controlled likewise.

A TFT using a thin film formed of the Al—Zn—Sn oxide according to the present invention as an active layer and including source and drain electrodes, a gate electrode, and a gate insulator may be used as a backplane device for flat panel displays (FPDs), such as active-matrix liquid crystal displays (AMLCDs), active-matrix organic light emitting diode (AMOLED) displays, and active-matrix field emission displays (AMFEDs).

Also, a TFT using a thin film formed of the Al—Zn—Sn oxide according to the present invention as an active layer and including source and drain electrodes, a gate electrode, and a gate insulator may be used as an inverter for thin-film electrical circuits.

In addition, a TFT using a thin film formed of the Al—Zn—Sn oxide according to the present invention as an active layer and including source and drain electrodes, a gate electrode, and a gate insulator may be used as an amplifier for thin-film electrical circuits.

Hereinafter, exemplary embodiments of the present invention will be described in more detail, but the present invention is not limited thereto.

Embodiment 1

Figure 5:
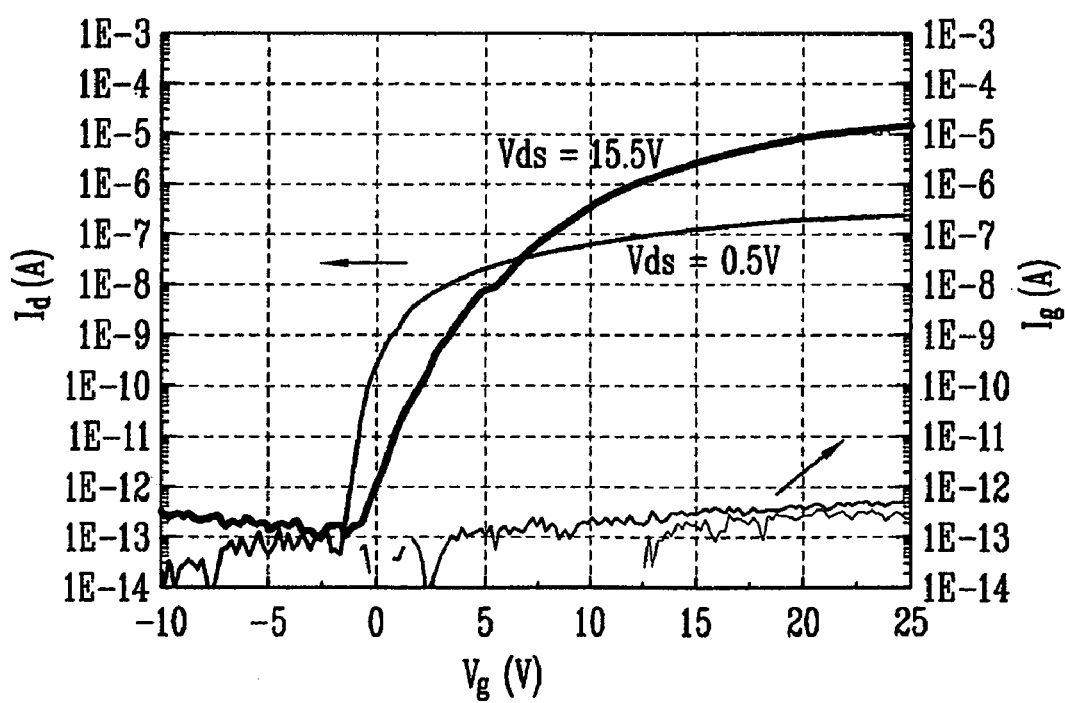
FIG. 5 is a graph showing source/drain current-gate voltage ($I_{ds}$-$V_g$) characteristics of a bottom-gate FET in which an active layer formed of an aluminum (Al)-zinc (Zn)-tin (Sn) oxide was deposited at room temperature according to an exemplary embodiment of the present invention.

A 100 mm×100 mm alkaline-free glass substrate was sequentially cleaned with acetone, isopropyl alcohol, and deionized water using an ultrasonic bath. Thereafter, ITO was deposited on the substrate to a thickness of about 150 nm using a DC-RF magnetron sputter and patterned, thereby forming a gate electrode. A gate insulator was formed by depositing alumina to a thickness of about 170 nm at 150° C. using an ALD technique. ITO was deposited to a thickness of about 150 nm using a DC-RF magnetron sputter and patterned, thereby forming source and drain electrodes. An active layer was deposited on the source and drain electrodes to a thickness of about 30 nm at room temperature using an RF magnetron sputter with a target containing 4 mol % $AlO_x$, 66 mol % ZnO, and 30 mol % $SnO_2$. The sputtering process was performed under a chamber pressure of 0.2 Pa with a sputtering power of 300 W in an $Ar/O_2$ atmosphere, and all the patterning processes were performed using a photolithography process and a wet etching process. As a result, a bottom-gate coplanar TFT was fabricated. The source/drain current-gate voltage ($I_{ds}$-$V_g$) characteristics of the bottom-gate coplanar TFT were measured as shown in FIG. 5.

Embodiment 2

Figure 6:
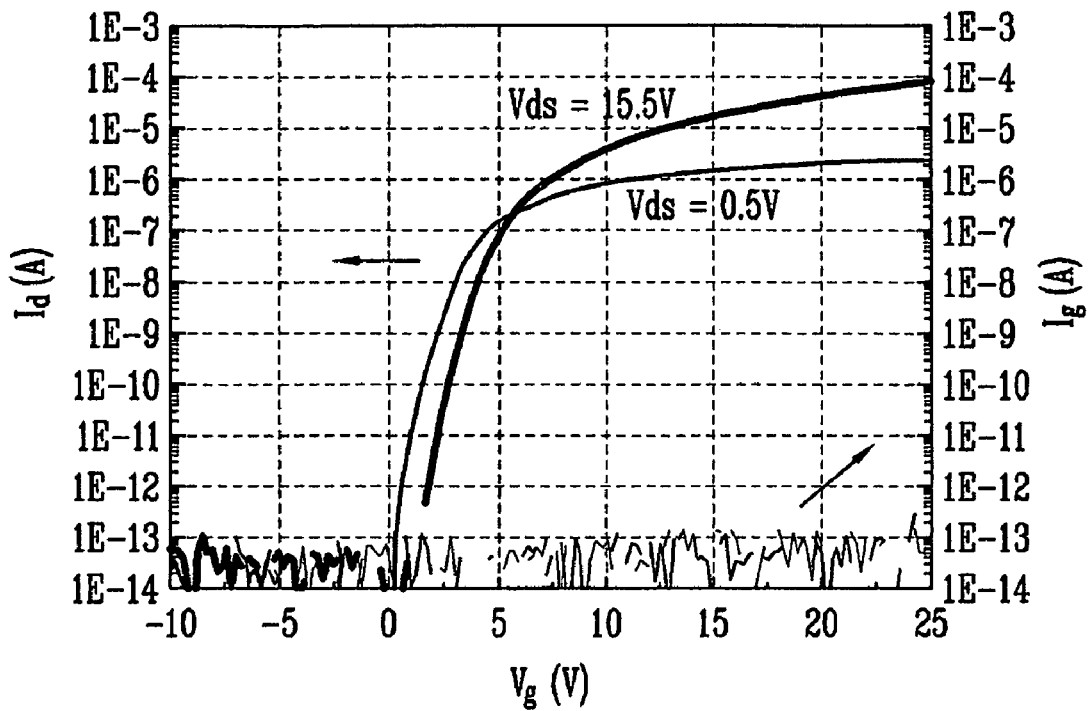
FIG. 6 is a graph showing $I_{ds}$-$V_g$ characteristics of a bottom-gate FET that was post-annealed at 150° C. according to an exemplary embodiment of the present invention.

A TFT was fabricated using the same process as in Embodiment 1 except that the TFT was annealed for 1 hour at 150° C. in vacuum. Thereafter, the $I_{ds}$-$V_g$ characteristics of the TFT were measured as shown in FIG. 6.

Embodiment 3

Figure 7:
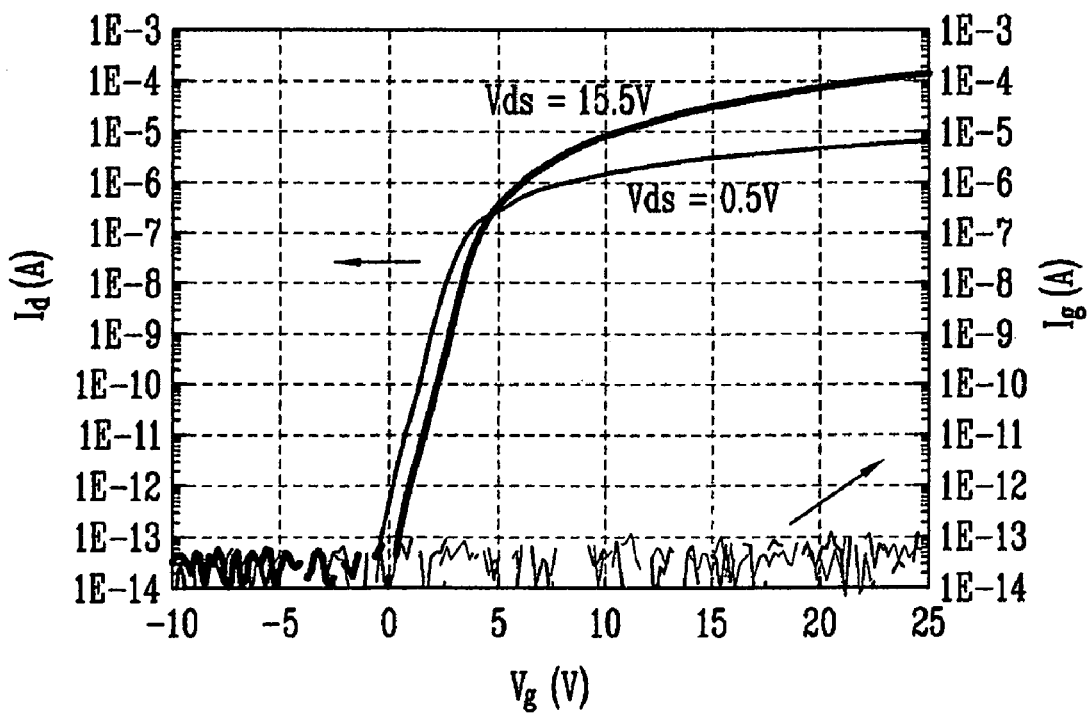
FIG. 7 is a graph showing $I_{ds}$-$V_g$ characteristics of a bottom-gate FET that was post-annealed at 180° C. according to an exemplary embodiment of the present invention.

A TFT was fabricated using the same process as in Embodiment 1 except that the TFT was annealed for 1 hour at 180° C. in vacuum. Thereafter, the $I_{ds}$-$V_g$ characteristics of the TFT were measured as shown in FIG. 7.

Embodiment 4

Figure 8:
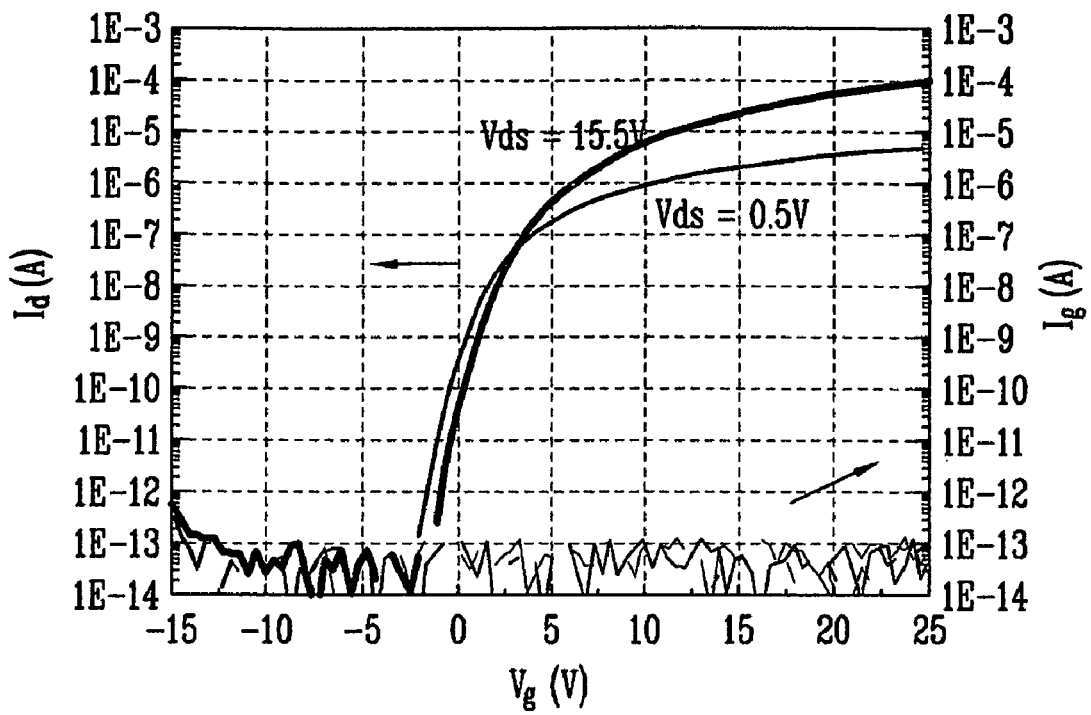
FIG. 8 is a graph showing $I_{ds}$-$V_g$ characteristics of a bottom-gate FET that was post-annealed at 180° C. without a passivation layer according to another exemplary embodiment of the present invention.

A 100 mm×100 mm alkaline-free glass substrate was sequentially cleaned with acetone, isopropyl alcohol, and deionized water using an ultrasonic bath. Thereafter, ITO was deposited on the cleaned glass substrate to a thickness of about 150 nm using a DC-RF magnetron sputter and patterned, thereby forming a gate electrode. A gate insulator was formed by depositing alumina to a thickness of about 170 nm at 150° C. using an ALD technique. ITO was deposited to a thickness of about 150 nm using a DC-RF magnetron sputter and patterned, thereby forming source and drain electrodes. An active layer was deposited on the source and drain electrodes to a thickness of about 30 nm at room temperature using an RF magnetron sputter having a target containing 5 mol % $Al_2O_3$, 83 mol % ZnO, and 12 mol % $SnO_2$. As a result, a bottom-gate coplanar TFT was fabricated. The sputtering process was performed under a chamber pressure of 0.2 Pa with a sputtering power of 300 W in an $Ar/O_2$ atmosphere. Subsequently, the bottom-gate coplanar TFT was annealed at 180° C. for 1 hour in a vacuum environment. The $I_{ds}$-$V_g$ characteristics of the bottom-gate coplanar TFT were measured as shown in FIG. 8.

Embodiment 5

Figure 9:
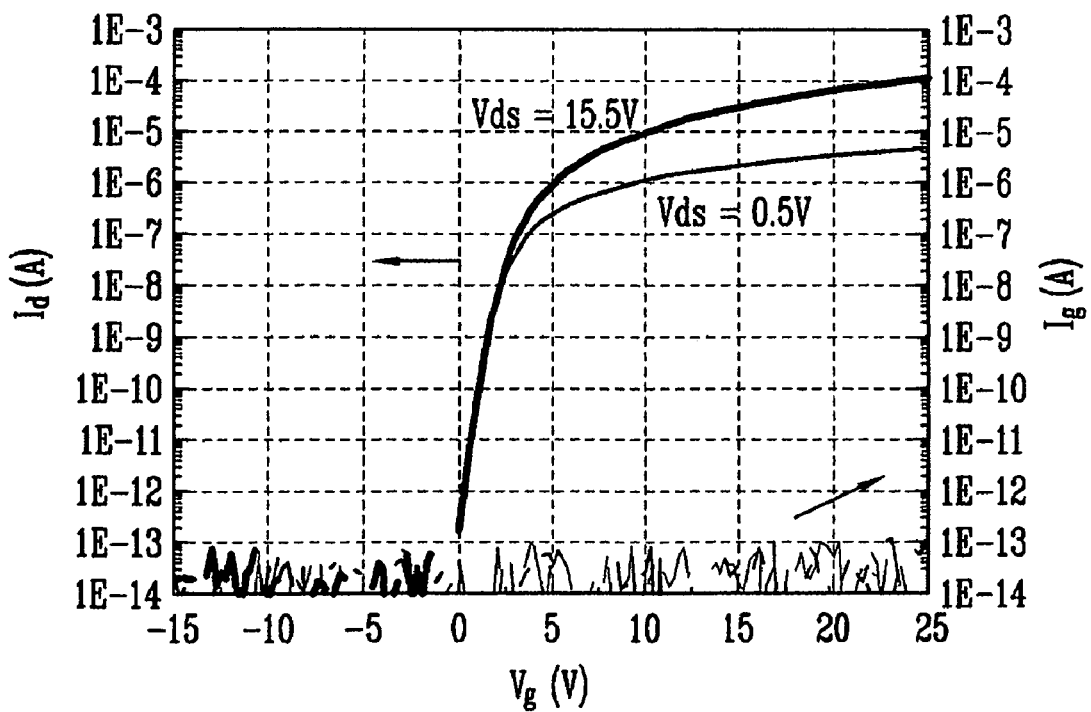
FIG. 9 is a graph showing $I_{ds}$-$V_g$ characteristics of a bottom-gate FET that was post-annealed at 180° C. after a passivation layer was formed, according to still another exemplary embodiment of the present invention.

A TFT was fabricated using the same process as in Embodiment 4 except that a passivation layer was formed by coating polyimide to a thickness of about 500 nm using a spin coating process after an active layer was formed, and the TFT was annealed at 180° C. for 1 hour in vacuum. The $I_{ds}$-$V_g$ characteristics of the bottom-gate coplanar TFT were measured as shown in FIG. 9.

Embodiment 6

Figure 10:
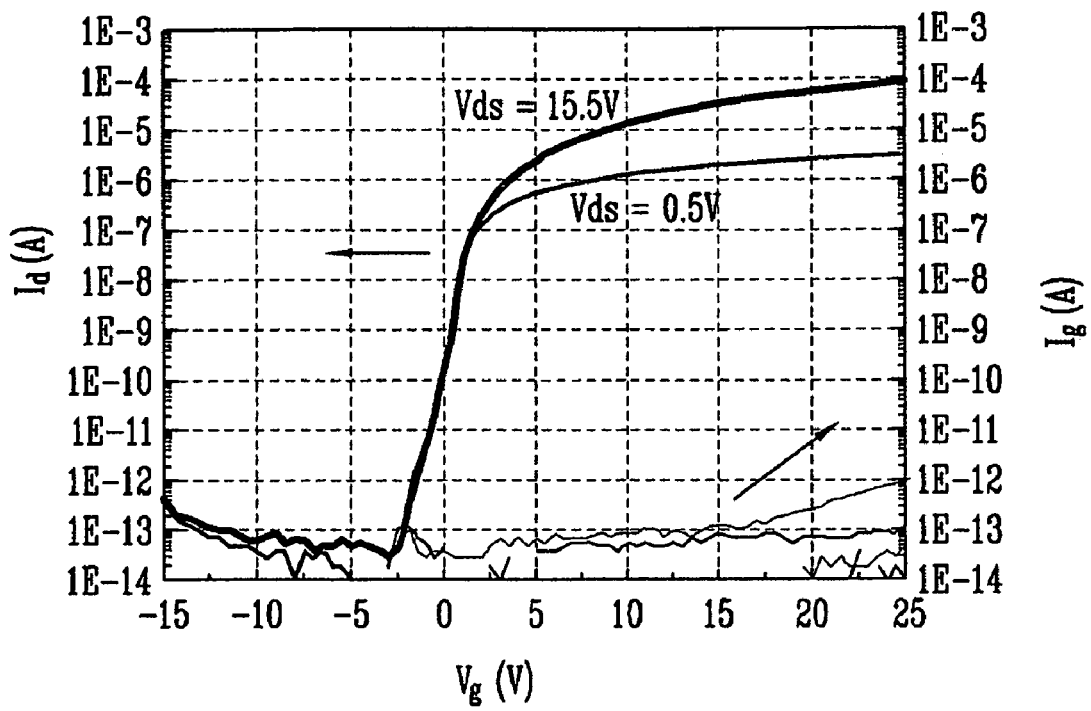
FIG. 10 is a graph showing $I_{ds}$-$V_g$ characteristics of a top-gate FET according to yet another exemplary embodiment of the present invention.

A 100 mm×100 mm alkaline-free glass substrate was sequentially cleaned with acetone, isopropyl alcohol, and deionized water using an ultrasonic bath. Thereafter, ITO was deposited to a thickness of about 150 nm using a DC-RF magnetron sputter and patterned, thereby forming source and drain electrodes. An active layer was deposited on the source and drain electrodes to a thickness of about 30 nm at room temperature using an RF magnetron sputter having a target containing 4 mol % $Al_2O_3$, 66 mol % ZnO, and 30 mol % $SnO_2$. The sputtering process was performed under a chamber pressure of 0.2 Pa with a sputtering power of 300 W in an $Ar/O_2$ atmosphere. A gate insulator was formed by depositing alumina to a thickness of about 170 nm at a temperature of about 150° C. using an ALD technique. ITO was deposited to a thickness of about 150 nm using a DC-RF magnetron sputter and patterned, thereby forming a gate electrode. As a result, a top-gate coplanar TFT was fabricated. Subsequently, the top-gate coplanar TFT was annealed at 300° C. for 1 hour in an $O_2$ atmosphere. The $I_{ds}$-$V_g$ characteristics of the top-gate coplanar TFT were measured as shown in FIG. 10.

Evaluation of Characteristics of the TFTs

On evaluation of the $I_{ds}$-$V_g$ characteristics of the TFTs fabricated according to Embodiments 1 through 6 as shown in FIGS. 5 through 10, it can be seen that all the bottom-gate and top-gate TFTs, each of which used the active layer formed of Al—Zn—Sn oxides, exhibited excellent electrical characteristics, which will now be described in detail.

Evaluation of Characteristics of the TFTs Before and After Annealing

As can be seen from FIGS. 5 through 7, which show the $I_{ds}$-$V_g$ characteristics of the TFTs fabricated in Embodiments 1 through 3, the annealed TFTs exhibited better electrical characteristics than the unannealed TFT. Specifically, after the TFT was annealed, a sub-threshold voltage swing (S/S) was improved, and field effect mobility was increased at least about 3 to 5 times.

In addition, when comparing the $I_{ds}$-$V_g$ characteristics of the TFTs with different Al, Zn, and Sn contents in Embodiments 4 and 5 as shown in FIGS. 8 and 9, it can be also seen that the annealed TFT exhibited better electrical characteristics.

Evaluation of Characteristics of the TFTs According to Sn Content

Figure 11:
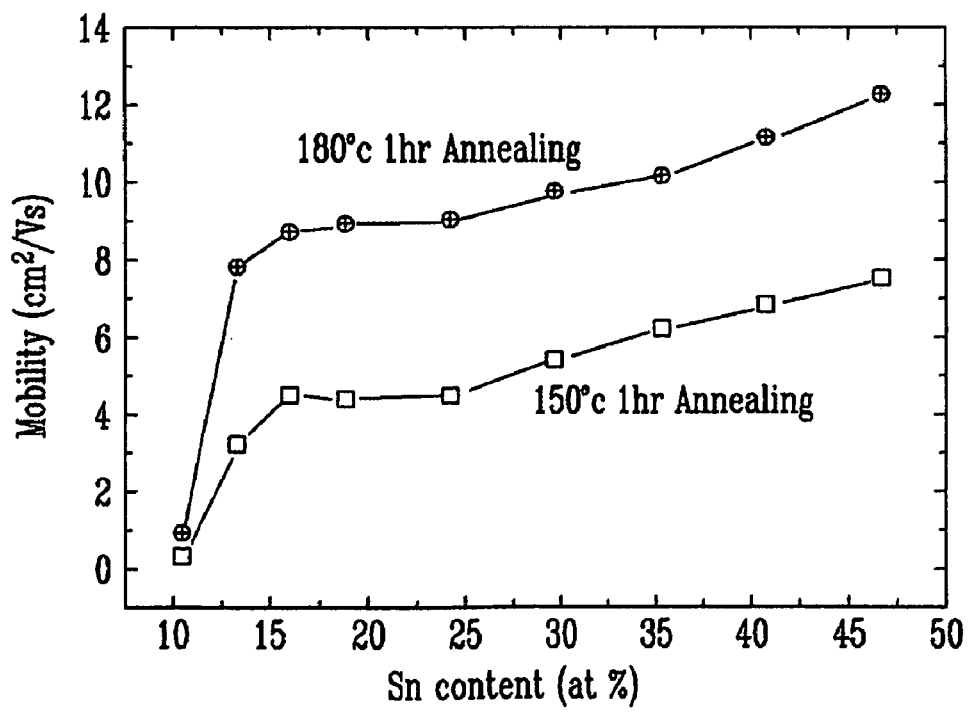
FIG. 11 is a graph of field effect mobility according to Sn content.

The TFTs were fabricated using the same processes as in Embodiments 2 and 3 except that Sn content was varied in the composition $[(1-x)(Al_{0.06}Zn_{0.94})x(Sn)]O_y$ of the Al—Zn—Sn oxide constituting the active layer. The field effect mobility of each of the TFTs according to the Sn content was measured as shown in FIG. 11. As a result, in both the TFTs annealed at temperatures of about 150° C. and 180° C., respectively, as the Sn content increased, the field effect mobility also increased.

Evaluation of Characteristics of the TFTs According to $O_2$ Partial Pressure

Figure 12:
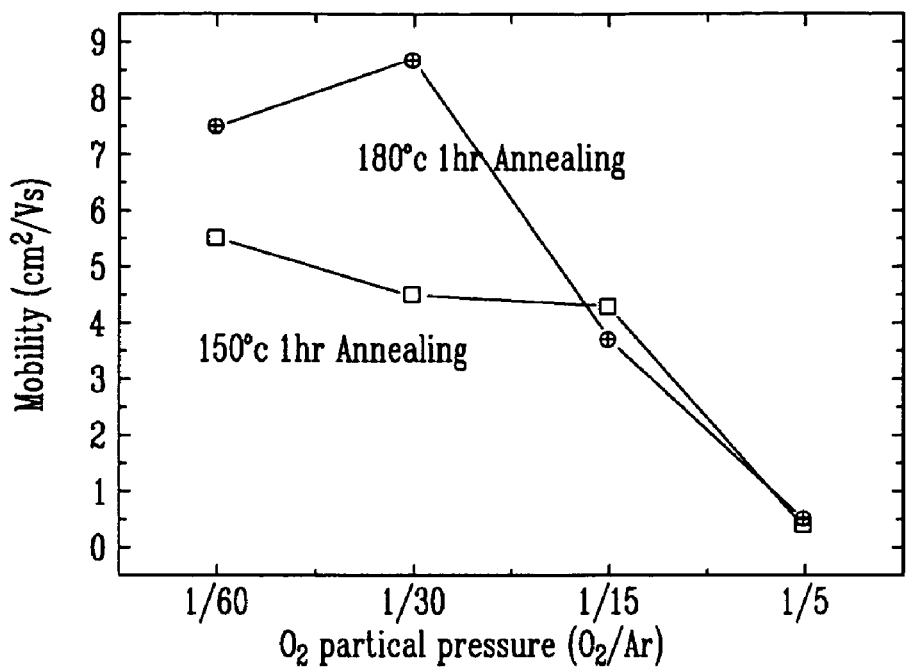
FIG. 12 is a graph of field effect mobility according to $O_2$ partial pressure.

The TFTs were fabricated using the same processes as in Embodiments 2 and 3 except that $O_2$ partial pressure was varied during the formation of the active layer. The field effect mobility of each of the TFTs according to the $O_2$ partial pressure was measured as shown in FIG. 12. As a result, it can be seen that as the $O_2$ partial pressure increased, the field effect mobility decreased.

Evaluation of Amorphous Phases of Al—Zn—Sn Oxide Thin Films

Figure 13:
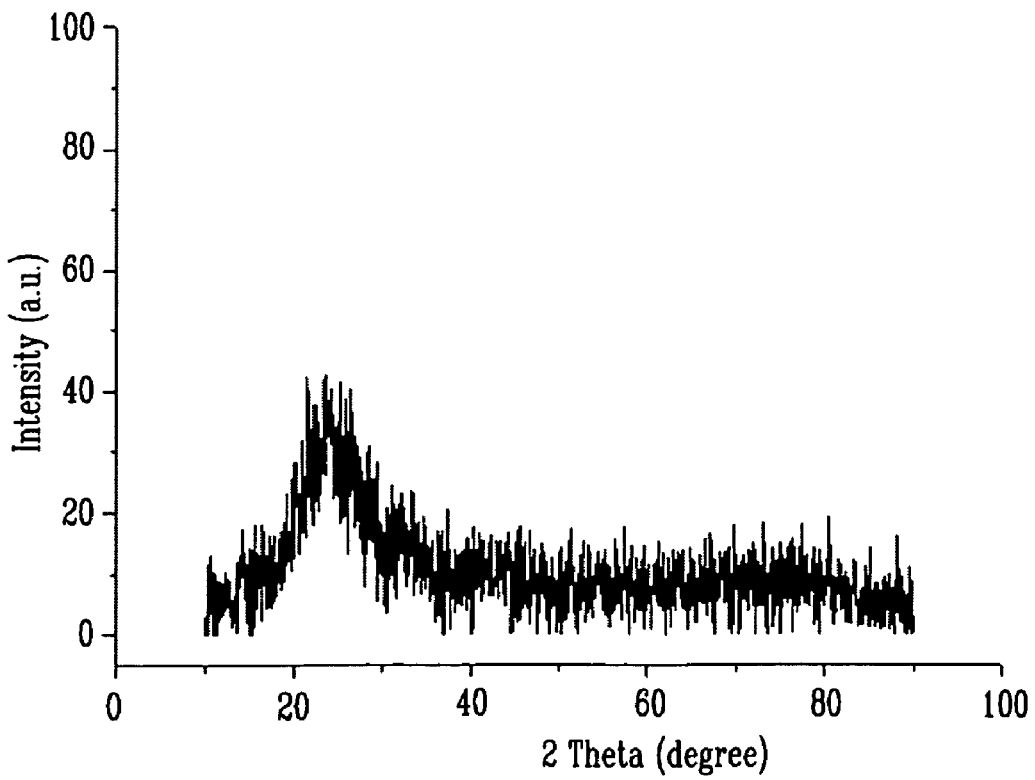
FIG. 13 is an X-ray diffraction (XRD) spectrum of an Al—Zn—Sn oxide thin film deposited at room temperature according to an exemplary embodiment of the present invention.
Figure 14:
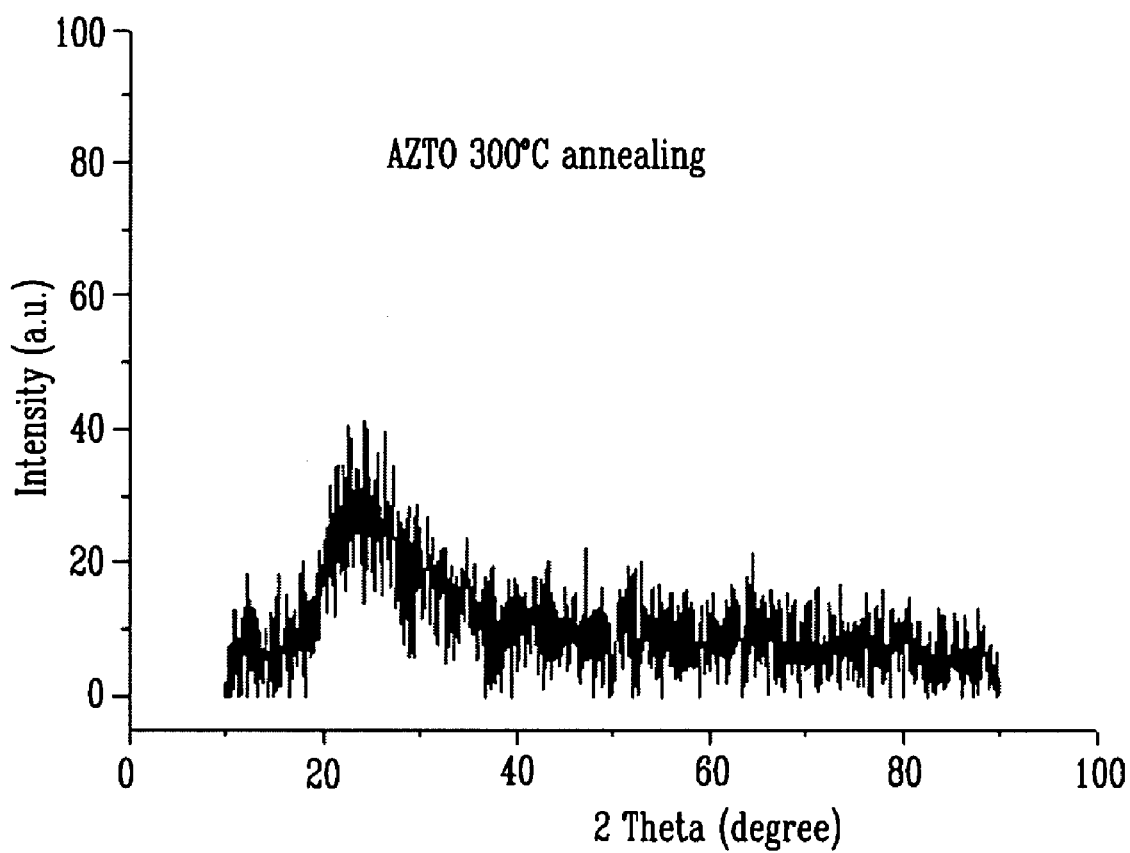
FIG. 14 is an XRD spectrum of an Al—Zn—Sn oxide thin film deposited at room temperature after annealed at 300° C., according to an exemplary embodiment of the present invention.

A thin film was deposited to a thickness of about 150 nm at room temperature using an RF magnetron sputter having a target containing 4.5 mol % $Al_2O_3$, 65.5 mol % ZnO, and 30 mol % $SnO_2$ and the X-ray diffraction spectrum of the film was measured. Thereafter, the thin film was annealed at a temperature of about 300° C. for 1 hour and the X-ray diffraction spectrum of the film was measured again. The results of the measurements are shown in FIGS. 13 and 14. As can be seen from FIGS. 13 and 14, the thin film remained in amorphous phase both before and after the annealing.

As described above, a composition for an oxide semiconductor thin film comprising an aluminum oxide, a zinc oxide, and a tin oxide according to the present invention enables formation of a transparent oxide semiconductor thin film without using expensive elements.

Also, a composition for an oxide semiconductor thin film comprising an aluminum oxide, a zinc oxide, and a tin oxide according to the present invention enables formation of a transparent oxide semiconductor thin film without using toxic heavy metals such as Cd and Pb.

Since a thin film with a composition according to the present invention can be used as an active layer using a low-temperature process at a temperature of 200° C. or less, a TFT using the active layer can obtain good characteristics.

A thin film with a composition according to the present invention can be applied to fabrication of a TFT using a low-temperature substrate, such as a plastic substrate, which requires a process temperature less than about 200° C.

Also, compounds with a composition according to the present invention are chemically stable and highly durable.

In addition, an amorphous thin film can be easily fabricated using a composition according to the present invention. Particularly, since the thin film formed of the composition according to the present invention can remain in amorphous phase even after a high-temperature process at a temperature of 400° C. or less, it is advantageous for fabrication of a uniform large-area electronic device.

Since a composition according to the present invention enables formation of a semiconductor thin film having good TFT characteristics using a sputtering process at room temperature, it is advantageous for fabrication of a large-area electronic device with low cost.

Furthermore, a transparent electronic device with a transmittance of 70% or higher in the visible region can be fabricated using an active layer formed of a composition for an oxide semiconductor thin film according to the present invention.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A composition for an oxide semiconductor thin film, comprising:
   from about 50 to about 99 mol % of a zinc oxide (ZnO);
   from about 0.5 to 49.5 mol % of a tin oxide ($SnO_x$); and
   remaining molar percentage of an aluminum oxide ($AlO_x$);
   wherein said oxide semiconductor thin film formed of the composition is in amorphous phase at a temperature of 400° C. or less.

2. The composition according to claim 1, wherein the aluminum oxide is $Al_2O_3$, the zinc oxide is ZnO, and the tin oxide is $SnO_2$.

3. A field effect transistor (FET), comprising:
   source and drain electrodes;
   a gate insulator;
   an active layer; and
   a gate electrode disposed on a substrate,
   wherein the active layer is formed of an oxide containing;
   from about 50 to about 99 mol % of a zinc oxide (ZnO);
   from about 0.5 to 49.5 mol % of a tin oxide ($SnO_x$); and
   remaining molar percentage of an aluminum oxide ($AlO_x$), and is in amorphous phase at a temperature of 400° C. or less, and
   wherein at least one of the source and drain electrodes and the gate electrode is formed with a transparent material that transmits visible light.

4. The FET according to claim 3, wherein the aluminum oxide is $Al_2O_3$, the zinc oxide is ZnO, and the tin oxide is $SnO_2$.

5. The FET according to claim 3, wherein the active layer has electrical properties that are controlled by Al or Sn content of the active layer.

6. The FET according to claim 3, which has a bottom-gate coplanar structure in which the gate electrode, the gate insulator, the source and drain electrodes, and the active layer are sequentially disposed on the substrate.

7. The FET according to claim 3, which has a bottom-gate staggered structure in which the gate electrode, the gate insulator, the active layer, and the source and drain electrodes are sequentially disposed on the substrate.

8. The FET according to claim 3, which has a top-gate coplanar structure in which the source and drain electrodes, the active layer, the gate insulator, and the gate electrode are sequentially disposed on the substrate.

9. The FET according to claim 3, which has a top-gate staggered structure in which the active layer, the source and drain electrodes, the gate insulator, and the gate electrode are sequentially disposed on the substrate.

* * * * *